(12) United States Patent
Nozawa et al.

(10) Patent No.: US 10,684,632 B2
(45) Date of Patent: Jun. 16, 2020

(54) PRESSURE CONTROL DEVICE AND PRESSURE CONTROL SYSTEM

(71) Applicant: FUJIKIN INCORPORATED, Osaka-shi, Osaka (JP)

(72) Inventors: Takahiro Nozawa, Osaka (JP); Yoshitomo Kanai, Osaka (JP); Takeshi Nakamura, Osaka (JP)

(73) Assignee: FUJIKIN INCORPORATED, Osaka (JP)

( * ) Notice: Subject to any disclaimer, the term of this patent is extended or adjusted under 35 U.S.C. 154(b) by 0 days.

(21) Appl. No.: 16/128,843

(22) Filed: Sep. 12, 2018

(65) Prior Publication Data
US 2019/0018434 A1  Jan. 17, 2019

Related U.S. Application Data

(63) Continuation-in-part of application No. PCT/JP2017/012823, filed on Mar. 29, 2017.

(30) Foreign Application Priority Data

Mar. 30, 2016 (JP) .................................. 2016-068159

(51) Int. Cl.
  *G05D 16/20* (2006.01)
  *G05D 7/06* (2006.01)
  *H01L 21/67* (2006.01)

(52) U.S. Cl.
  CPC ............ *G05D 16/20* (2013.01); *G05D 7/0623* (2013.01); *G05D 7/0635* (2013.01);
  (Continued)

(58) Field of Classification Search
  CPC ........ Y10T 137/2544; Y10T 137/7761; G05D 16/20; G05D 7/0623; G05D 7/0635; H01L 21/67017
  (Continued)

(56) References Cited

U.S. PATENT DOCUMENTS 4,887,636 A * 12/1989 Rothen .................. B60T 8/327
                                                137/487.5
5,257,640 A * 11/1993 Delajoud ................ B01J 3/002
                                                137/102
(Continued)

FOREIGN PATENT DOCUMENTS

JP      H07-182050 A      7/1995
JP      H07-295657 A      11/1995
(Continued)

OTHER PUBLICATIONS

Aug. 19, 2019 Office Action issued in Korean Patent Appllication No. 10-2018-7021953.

*Primary Examiner* — William M McCalister
(74) *Attorney, Agent, or Firm* — Cantor Colburn LLP

(57) ABSTRACT

A pressure control device controls a flow rate of gas supplied to a pressure control target to maintain an inside of the pressure control target at set pressure. The pressure control device includes a controller that is configured to: subtract, at a predetermined ratio, a signal related to the supply of gas from a set pressure signal indicating the set pressure, when gas is being supplied into the pressure control target in order to bring the inside of the pressure control target to the set pressure; compare a detected pressure signal indicating pressure within the pressure control target with the set pressure signal subjected to the subtraction; and control, on the basis of a comparison result obtained by the controller, a flow rate control valve which controls a flow rate of gas supplied to the pressure control target.

6 Claims, 4 Drawing Sheets

(52) U.S. Cl.
CPC ... *G05D 16/2022* (2019.01); *H01L 21/67017*
(2013.01); *H01L 21/67253* (2013.01); *H01L 21/6719* (2013.01)

(58) Field of Classification Search
USPC .............................................. 137/102, 487.5
See application file for complete search history.

(56) References Cited

U.S. PATENT DOCUMENTS

| | | | | |
|---|---|---|---|---|
| 5,443,087 | A * | 8/1995 | Myles | G05D 16/2093 137/14 |
| 6,021,799 | A * | 2/2000 | Price | B05B 7/1404 137/102 |
| 6,247,765 | B1 * | 6/2001 | Oyama | B60T 8/3665 303/119.2 |
| 6,305,401 | B1 * | 10/2001 | Uehara | G05D 16/2095 137/102 |
| 6,779,541 | B2 * | 8/2004 | Inayama | G05D 16/2095 137/102 |
| 7,505,818 | B1 * | 3/2009 | Kohler | G05B 11/28 137/102 |
| 2012/0116596 | A1 | 5/2012 | Yoneda et al. | |
| 2017/0351274 | A1 * | 12/2017 | Nozawa | G05B 11/011 |

FOREIGN PATENT DOCUMENTS

| | | |
|---|---|---|
| JP | H11-154024 A | 6/1999 |
| JP | 5607501 B2 | 10/2014 |

* cited by examiner

PRESSURE CONTROL DEVICE AND PRESSURE CONTROL SYSTEM

CROSS REFERENCE TO RELATED APPLICATION

This application is a continuation-in-part application of International Application No. PCT/JP2017/012823, filed Mar. 29, 2017, which claims priority to Japanese Patent Application No. 2016-068159, filed Mar. 30, 2016. The contents of these applications are incorporated herein by reference in their entirety.

BACKGROUND

The present disclosure relates to a pressure control device and a pressure control system used in a semiconductor manufacturing device or the like.

Conventionally, a pressure control device for maintaining pressure within a chamber at a constant level is proposed in Japanese Patent Application Publication No. H07-182050. The pressure control device disclosed in Japanese Patent Application Publication No. H07-182050 switches on/off the supply of gas to control pressure within a chamber to a constant level on the basis of pressure within the chamber detected by a pressure sensor and on set pressure.

In addition, in recent years, due to miniaturization and increased lamination of semiconductor circuits, various parameters in a manufacturing process (for example, an ALD (atomic layer deposition) process or a laser CVD process) are required to be controlled with high accuracy, and pressure within a process chamber is also required to be controlled with high responsiveness and accuracy.

SUMMARY

Depending on equipment, there are cases where a volume of a chamber increases or a pipe between a pressure control device and the chamber lengthens relative to a control flow rate of gas. In such a case, performing the pressure control disclosed in Japanese Patent Application Publication No. H07-182050 creates a delay time from the moment a flow rate control valve is opened to initiate gas flow to the moment pressure within the chamber rises or from the moment the flow rate control valve is closed to the moment pressure drops. Therefore, the pressure within the chamber may repetitively rise and fall, thereby preventing the pressure within the chamber from being maintained at a constant level or increasing an amount of time required until the pressure within the chamber stabilizes.

In consideration thereof, an object of the present disclosure is to provide a pressure control device and a pressure control system with which pressure within a chamber can be quickly maintained at a constant level even when a volume of the chamber relative to a gas control flow rate is large or a pipe between a flow rate control valve and the chamber is long.

In order to achieve the object described above, a pressure control device according to one aspect of the present disclosure controls a flow rate of gas supplied to a pressure control target to maintain an inside of the pressure control target at set pressure. The pressure control device includes a controller that is configured to: subtract, at a predetermined ratio, a signal related to the supply of gas from a set pressure signal indicating the set pressure, when gas is being supplied into the pressure control target in order to bring the inside of the pressure control target to the set pressure; compare a detected pressure signal indicating pressure within the pressure control target with the set pressure signal subjected to the subtraction; and control, on the basis of a comparison result obtained by the controller, a flow rate control valve which controls a flow rate of gas supplied to the pressure control target.

A pressure control device according to another aspect of the present disclosure controls a flow rate of gas that flows out from a pressure control target to maintain an inside of the pressure control target at set pressure. The pressure control device includes a controller that is configured to add, at a predetermined ratio, a signal related to the outflow of gas to a set pressure signal indicating the set pressure, when gas is caused to flow out from the pressure control target in order to bring the inside of the pressure control target to the set pressure; compare a detected pressure signal indicating pressure within the pressure control target with the set pressure signal subjected to the addition; and control, on the basis of a comparison result obtained by the controller, a flow rate control valve which controls a flow rate of gas that flows out from the pressure control target.

A pressure control system according to one aspect of the present disclosure includes: a gas supply source that supplies gas; a pressure control target to which gas is supplied from the gas supply source; a pressure sensor that detects pressure within the pressure control target; and the pressure control device according to one aspect of the present disclosure which is provided between the gas supply source and the pressure control target and which controls a flow rate of gas supplied to the pressure control target to maintain the pressure control target at set pressure.

A pressure control system according to another aspect of the present disclosure includes: a gas supply source that supplies gas; a pressure control target to which gas is supplied from the gas supply source; a pressure sensor that detects pressure within the pressure control target; and the pressure control device according to another aspect of the present disclosure which is provided on a secondary side of the pressure control target and which controls a flow rate of gas that flows out from the pressure control target to maintain the pressure control target at set pressure.

DETAILED DESCRIPTION

Hereinafter, a pressure control device 1 and a pressure control system 10 according to an embodiment of the present disclosure will be described with reference to the drawings.

Figure 1:
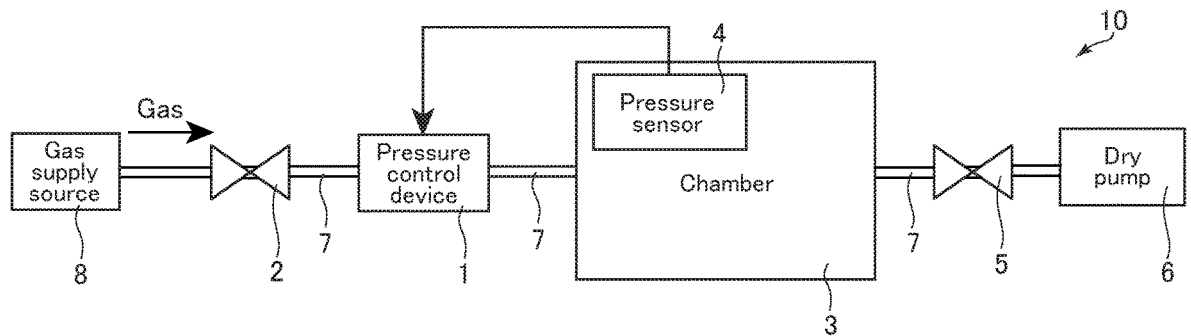
FIG. 1 is a configuration diagram of a pressure control system including a pressure control device according to an embodiment of the present disclosure.

FIG. 1 is a configuration diagram of the pressure control system 10 including the pressure control device 1.

The pressure control system 10 includes the pressure control device 1, an on-off valve 2, a chamber 3 that is a pressure control target, a pressure sensor 4, a variable valve 5, a dry pump 6, a pipe 7, and a gas supply source 8.

The gas supply source 8 is connected to the pressure control device 1 via the pipe 7. The on-off valve 2 is provided on an upstream side of the pressure control device 1.

The chamber 3 is provided with the pressure sensor 4 for detecting pressure within the chamber 3 and is connected to the pressure control device 1 via the pipe 7. Pressure detected by the pressure sensor 4 is sent to the pressure control device 1 as a detected pressure signal. The chamber 3 and the dry pump 6 are connected by the pipe 7, and the variable valve 5 is provided between the chamber 3 and the dry pump 6.

Next, a configuration of the pressure control device 1 will be described with reference to FIG. 2.

Figure 2:
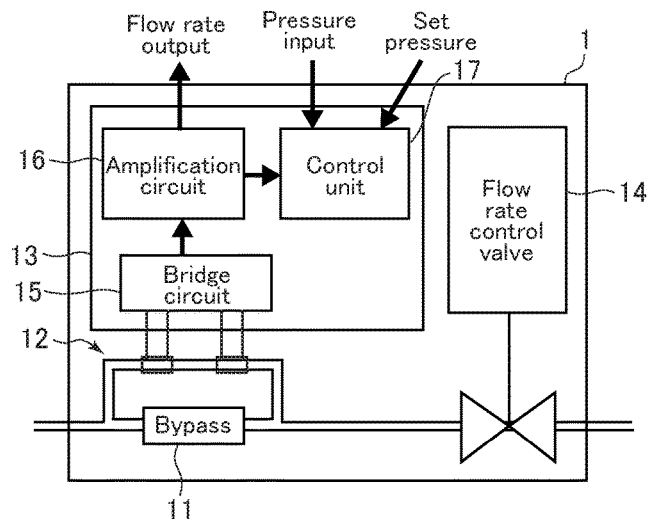
FIG. 2 is a configuration diagram of a pressure control device.

FIG. 2 is a configuration diagram of the pressure control device 1.

As shown in FIG. 2, the pressure control device 1 includes a bypass 11, a flow rate sensor 12, a control device 13, and a flow rate control valve 14 that is a solenoid valve. The control device 13 includes a bridge circuit 15, an amplification circuit 16, and a controller 17.

Gas having flowed into the pressure control device 1 is branched to the bypass 11 and the flow rate sensor 12 at a predetermined flow rate ratio. Two coils of the flow rate sensor 12 constitute a part of the bridge circuit 15. The amplification circuit 16 amplifies a signal related to a temperature difference detected by the bridge circuit 15 and outputs the signal as a flow rate signal (for example, 0 to 5 VDC) to the outside. The flow rate signal is also output to the controller 17.

Next, a configuration of the controller 17 will be described.

Figure 3:
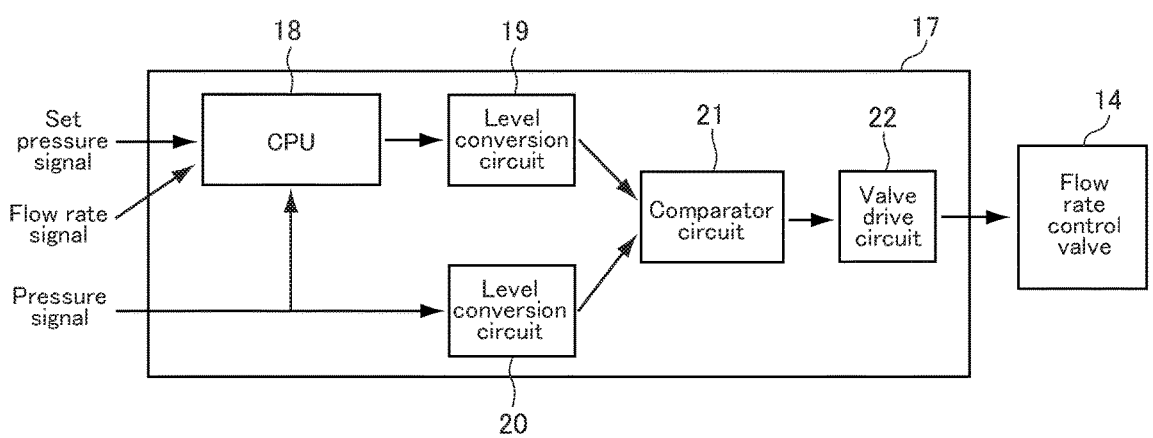
FIG. 3 is a block diagram of a flow rate control valve and a controller.

FIG. 3 is a block diagram of the flow rate control valve 14 and the controller 17.

As shown in FIG. 3, the controller 17 includes a CPU 18, two level conversion circuits 19 and 20, a comparator circuit 21, and a valve drive circuit 22.

The CPU 18 receives input of a set pressure signal (for example, 0 to 10 VDC) indicating a set pressure value of the chamber 3 which is input from outside, a flow rate signal (for example, 0 to 5 VDC) input from the amplification circuit 16, and a detected pressure signal (for example, 0 to 10 VDC) indicating a pressure value detected by the pressure sensor 4. The CPU 18 corresponds to set pressure subtracting means and performs processes described later with reference to FIG. 5 on the basis of the input set pressure signal, flow rate signal, and detected pressure signal.

The level conversion circuits 19 and 20 are, respectively, circuits for amplifying or attenuating the set pressure signal input from the CPU 18 and the detected pressure signal from the pressure sensor 4 to enable the signals to be accurately compared by the comparator circuit 21.

The comparator circuit 21 compares a level of the set pressure signal after correction with a level of the detected pressure signal, and outputs a difference signal indicating a difference between the levels to the valve drive circuit 22. The valve drive circuit 22 controls a degree of opening of the flow rate control valve 14 on the basis of the difference signal so that pressure within the chamber 3 becomes constant.

Next, operations upon start of control in the pressure control system 10 will be described with reference to FIGS. 4 and 5. Operations in a case where gas is supplied into the chamber 3 through the pressure control device 1 and the pressure control device 1 controls a flow rate of gas that flows into the chamber 3 to maintain pressure within the chamber 3 at a constant level will be described.

Figure 4:
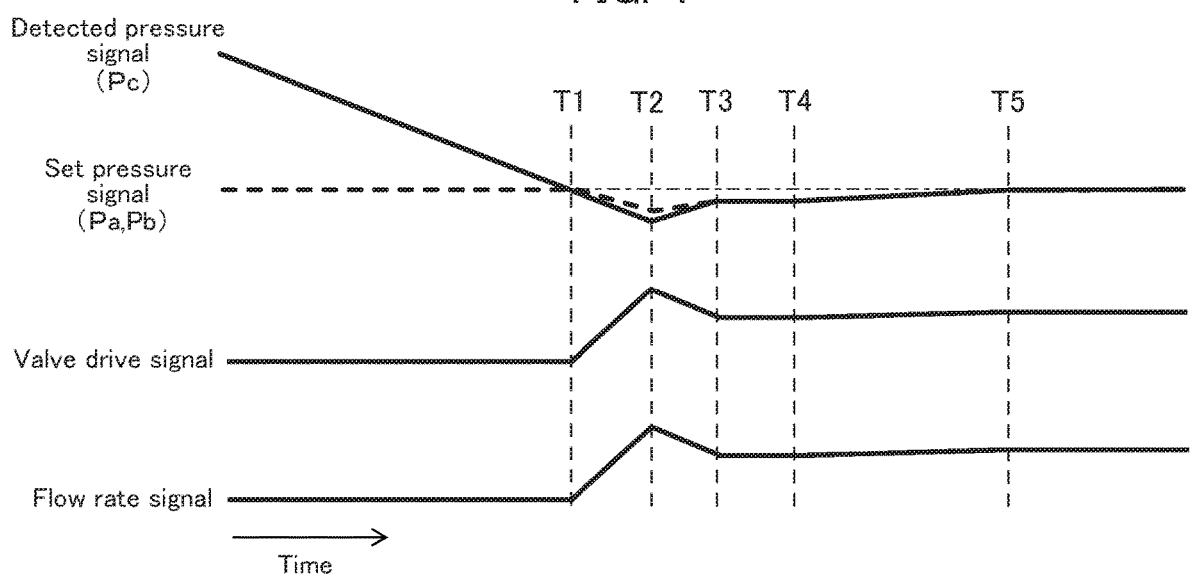
FIG. 4 is a diagram showing behaviors of a detected pressure signal, a set pressure signal, a valve drive signal, and a flow rate signal upon start of control of a pressure control system.

FIG. 4 shows behaviors of a detected pressure signal, a set pressure signal, a valve drive signal, and a flow rate signal upon start of control of the pressure control system 10. The detected pressure signal detected by the pressure sensor 4 is indicated by a solid line, the set pressure signal is indicated by a dotted line, the valve drive signal is indicated by a solid line, and the flow rate signal is indicated by a solid line.

Figure 5:
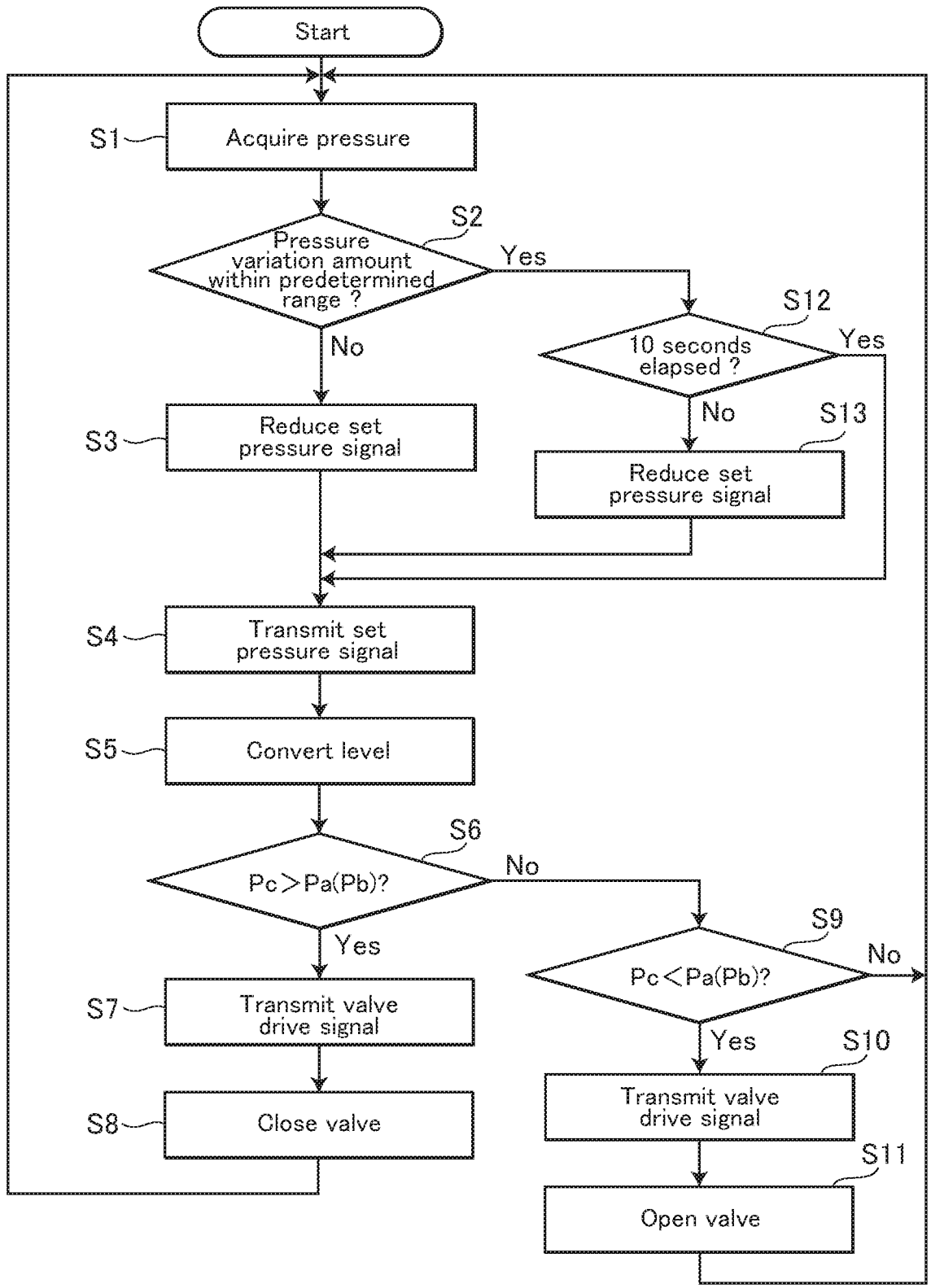
FIG. 5 is a flow chart of a pressure constant control process performed by the controller.

FIG. 5 is a flow chart of a pressure constant control process performed by the controller 17.

For example, when a volume of the chamber 3 is 1 m$^3$, a length of the pipe 7 between the pressure control device 1 and the chamber 3 is 10 m, and a flow rate of gas flowing through the pipe 7 is 300 sccm, the behaviors of the respective signals shown in FIG. 4 are obtained by performing the pressure constant control process shown in FIG. 5.

When suction of gas inside the chamber 3 is started by the dry pump 6 in a state where the variable valve 5 is set to a predetermined degree of opening, as shown in FIG. 4, the detected pressure signal decreases at a constant rate. At time T1, when the detected pressure signal becomes smaller than the set pressure signal, the flow rate control valve 14 opens and gas starts to flow. When the gas flows, the flow rate signal is subtracted from the set pressure signal at a predetermined ratio. Therefore, as the flow rate signal increases, the set pressure signal decreases.

At time T2, the detected pressure signal increases as the gas reaches the chamber 3. Accordingly, since the difference between the detected pressure signal and the set pressure signal decreases, the supply of gas also decreases, a subtraction amount from the set pressure signal also decreases, and the set pressure signal increases. Therefore, after time T2, the detected pressure signal and the set pressure signal approach a same level and, at time T3, the detected pressure signal and the set pressure signal become approximately equal to each other to create a pressure constant control state where the detected pressure signal and the set pressure signal are approximately constant while the flow rate control valve 14 remains at a certain degree of opening.

However, since subtracting the flow rate signal from the set pressure signal on the basis of the flow rate of gas still continues, the detected pressure signal and the set pressure signal are controlled to be constant at a lower level than an original level of the set pressure signal indicated by a dashed-dotted line. Therefore, at time T4, once a certain period of time has elapsed in the pressure constant control state where the detected pressure signal and the set pressure signal are approximately equal to each other, the subtraction amount from the set pressure signal is gradually reduced to zero. Accordingly, after time T5 elapses, constant control is attained at an original level of the set pressure signal.

Next, the pressure constant control process shown in FIG. 5 will be described. In FIG. 5, the CPU 18 acquires a set pressure signal and a detected pressure signal and a level conversion circuit 20 acquires the detected pressure signal (S1). The CPU 18 determines whether or not an amount of variation of the detected pressure signal in a certain period of time is within a predetermined range relative to a full scale of the pressure sensor 4 (S2). For example, the CPU 18 determines whether or not the amount of variation of the detected pressure signal during a period from the present time point to three seconds in the past is within 5% relative to the full scale of the pressure sensor 4.

When the amount of variation of the detected pressure signal in the certain period of time is not within a predetermined range (S2: No), the CPU 18 subtracts, at a predetermined ratio, the flow rate signal input from the amplification circuit 16 from the set pressure signal acquired in step S1 (S3). For example, when the set pressure signal is expressed by a configuration ratio Pa [%] relative to the full scale of the pressure sensor 4 and the flow rate signal from the amplification circuit 16 is expressed as a flow rate ratio F [%] relative to a full scale of the flow rate sensor 12, a value that is 1/100 of the flow rate ratio F is subtracted from the configuration ratio Pa. In other words, a configuration ratio Pb after subtraction satisfies Pb=Pa−F/100. Moreover, when there is no input of the flow rate signal from the amplification circuit 16 or, in other words, when the flow rate control valve 14 is in a closed state, since the flow rate ratio F [%] is zero, Pb=Pa is satisfied.

The CPU 18 sends the new set pressure signal calculated in step S3 to the level conversion circuit 19 (S4). The level conversion circuits 19 and 20 respectively amplify or attenuate the set pressure signal and the detected pressure signal to enable the signals to be accurately compared by the comparator circuit 21, and send the signals to the comparator circuit 21 (S5).

The comparator circuit 21 determines whether or not the detected pressure signal (Pc) is larger than the set pressure signal (Pa) (S6). When the detected pressure signal (Pc) is larger than the set pressure signal (Pa) (S6: Yes), the comparator circuit 21 sends a valve drive signal for changing the flow rate control valve 14 to a closed state to the valve drive circuit (S7). When the flow rate control valve 14 is in an open state, the valve drive circuit 22 changes the flow rate control valve 14 to a closed state, but when the flow rate control valve 14 is in a closed state, the valve drive circuit 22 leaves the flow rate control valve 14 as it is (S8).

On the other hand, when the detected pressure signal (Pc) is not larger than the set pressure signal (Pa) (S6: No), the comparator circuit 21 determines whether or not the detected pressure signal (Pc) is smaller than the set pressure signal (Pa) (S9). When the detected pressure signal (Pc) is smaller than the set pressure signal (Pa) (S9: Yes), the comparator circuit 21 calculates a difference between the detected pressure signal and the set pressure signal and sends a valve drive signal in accordance with the difference to the valve drive circuit 22 (S10). For example, based on the difference between the detected pressure signal and the set pressure signal, the comparator circuit 21 determines a degree of opening of the flow rate control valve 14 which causes the detected pressure signal and the set pressure signal to become equal to each other and sends a valve drive signal in accordance with the degree of opening to the valve drive circuit 22. The valve drive circuit 22 controls the flow rate control valve 14 to the degree of opening in accordance with the valve drive signal (S11).

In addition, when the detected pressure signal (Pc) is not smaller than the set pressure signal (Pa) (S9: No) or, in other words, when Pc and Pa are equal to each other, a return is made to step S1 without performing an operation of the flow rate control valve 14.

Furthermore, when the amount of variation of the detected pressure signal in the certain period of time is within a predetermined range relative to the full scale of the pressure sensor 4 (S2: Yes), the CPU 18 determines whether or not 10 seconds have elapsed from the moment an affirmative determination is initially made in step S2 (S12). When 10 seconds have elapsed (S12: Yes), the CPU 18 advances to step S4.

On the other hand, when 10 seconds have not elapsed (S12: No), the CPU 18 subtracts the flow rate signal from the set pressure signal at a predetermined ratio in accordance with an amount of elapsed time from the moment an affirmative determination is initially made in step S2 (S13). While a value that is 1/100 of the flow rate ratio F is subtracted from the configuration ratio Pa in step S3 described above, in step S13, the subtraction amount is reduced in accordance with an amount of elapsed time from the moment an affirmative determination is initially made in step S2 to zero over a predetermined amount of time (for example, 10 seconds). In other words, when the amount of elapsed time is denoted by t (seconds), the configuration ratio Pb after subtraction is calculated by an equation expressed as Pb=Pa−(F/100)*((10−t)/10). Accordingly, the subtraction amount decreases in accordance with the amount of elapsed time and, for example, the subtraction amount after 1 second is 90% of F/100, the subtraction amount after 2 seconds is 80% of F/100, and the subtraction amount from the set pressure signal becomes zero after 10 seconds. In this manner, as step S13 is repetitively performed, the subtraction amount from the set pressure signal gradually decreases to zero.

Next, a relationship between the behaviors of the respective signals shown in FIG. 4 and the pressure constant control process shown in FIG. 5 will be described.

In an initial stage of gas suction in FIG. 4, since the detected pressure signal decreases at a certain rate, it is determined that the amount of variation of the detected pressure signal in a certain period of time is not within a predetermined range (S2: No) and, since gas is not supplied, there is no input of the flow rate signal and the subtraction amount from the set pressure signal is zero (S3). In addition, since the detected pressure signal is larger than Pa (S6: Yes), the flow rate control valve 14 remains in a closed state (S8).

At time T1, since the detected pressure signal becomes smaller than the set pressure signal (S6: No, S9: Yes), the flow rate control valve 14 changes to an open state (S11) and, as gas is supplied, the set pressure signal is reduced on the basis of the flow rate of the gas (S3). At time T2, when the supplied gas reaches the chamber 3 and a gas supply amount to the chamber 3 exceeds a gas suction amount from the chamber 3, the detected pressure signal increases. As a result, since the difference between the detected pressure signal and the set pressure signal decreases, the supply of gas also decreases, the subtraction amount from the set pressure signal also decreases, and the set pressure signal increases.

After time T2, the detected pressure signal and the set pressure signal approach a same level and, at time T3, the detected pressure signal and the set pressure signal become approximately equal to each other to create a pressure constant control state. At time T4, once a certain period of time has elapsed in the pressure constant control state where the detected pressure signal and the set pressure signal are approximately equal to each other (S2: Yes), the subtraction amount from Pa is gradually reduced to zero over 10 seconds (S12, S13). After time T5 elapses, constant control is attained at an original level of Pa.

In this manner, when gas is being supplied to the chamber 3, the CPU 18 subtracts the flow rate signal from the set pressure signal at a predetermined ratio, the comparator circuit 21 compares the set pressure signal after subtraction with the detected pressure signal, and the valve drive circuit 22 controls the flow rate control valve 14 on the basis of a result of the comparison of signals by the comparator circuit 21.

According to the configuration described above, by subtracting the flow rate signal from the set pressure signal at a predetermined ratio, since a difference between the detected pressure signal and the set pressure signal can be reduced, the flow rate of gas supplied to the chamber 3 is suppressed. Therefore, a rise in pressure after the gas reaches the chamber 3 can be suppressed. In addition, when the detected pressure signal increases after the gas reaches the chamber 3, since the difference between the detected pressure signal and the set pressure signal decreases, the flow rate of gas decreases. Accordingly, the subtraction amount of the set pressure signal also decreases and the set pressure signal also increases. As a result, since the detected pressure signal and the set pressure signal approach each other without the detected pressure signal exceeding the set pressure signal, a pressure constant control state can be created without the flow rate control valve 14 performing an opening/closing operation.

In addition, when the amount of variation of the detected pressure signal in the certain period of time is within a predetermined range relative to the full scale of the pressure sensor 4, the CPU 18 gradually reduces the subtraction amount from the set pressure signal to zero and the comparator circuit 21 compares the detected pressure signal with the set pressure signal of which the subtraction amount is zero.

According to the configuration described above, by gradually restoring the set pressure signal having been subjected to subtraction, to an original set pressure signal, hunting can be suppressed and pressure within the chamber 3 can be quickly stabilized to set pressure.

It should be noted that the present disclosure is not limited to the embodiment described above. Various additions, modifications, and the like of the present disclosure will occur to those skilled in the art without departing from the scope of the disclosure.

Figure 6:
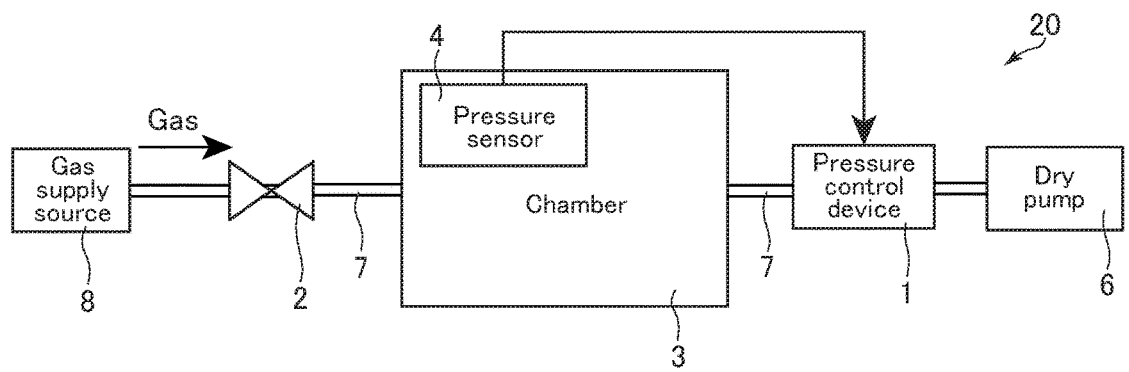
FIG. 6 is a configuration diagram of a pressure control system including a pressure control device according to a modification of the embodiment of the present disclosure.
Figure 7:
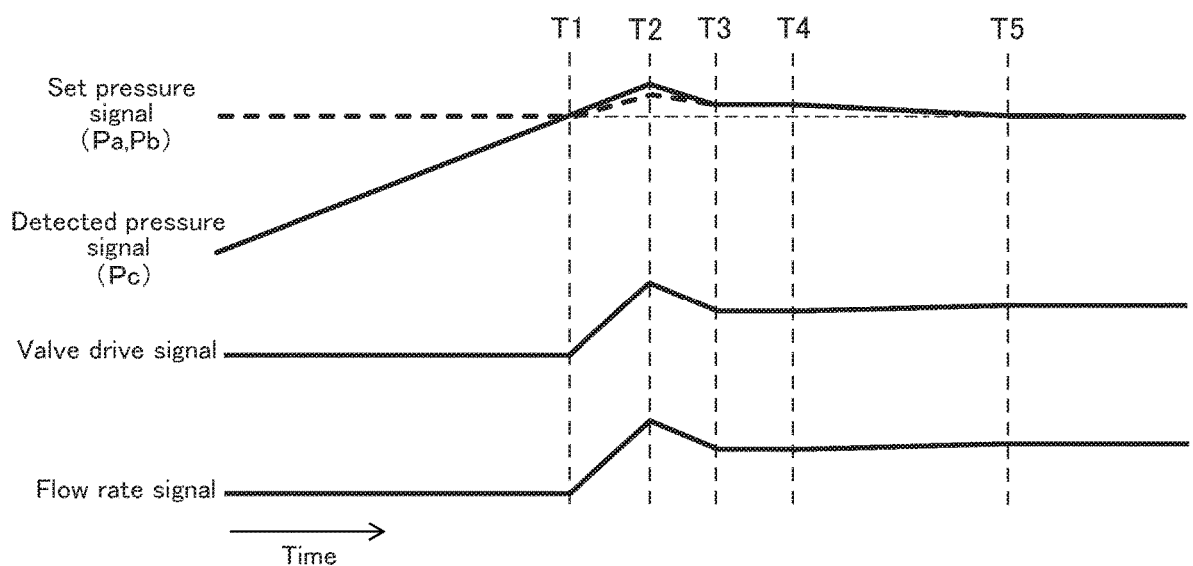
FIG. 7 is a diagram showing behaviors of a detected pressure signal, a set pressure signal, a valve drive signal, and a flow rate signal upon start of control of a pressure control system according to the modification.

While a case where a flow rate of gas that flows into the chamber 3 is controlled by the pressure control device 1 of the pressure control system 10 to make pressure within the chamber 3 constant has been described in the embodiment presented above, a flow rate of gas that flows out from the chamber 3 may be controlled by the pressure control device 1 in a pressure control system 20 shown in FIG. 6 to maintain pressure within a chamber at a constant level. In the pressure control system 20 shown in FIG. 6, the pressure control device 1 is provided between the chamber 3 and the dry pump 6 (on a secondary side of the chamber 3). FIG. 7 shows behaviors of a detected pressure signal, a set pressure signal, a valve drive signal, and a flow rate signal upon start of control of the pressure control system 20.

When supply of gas from the gas supply source 8 to the chamber 3 is started, as shown in FIG. 7, the detected pressure signal increases at a constant rate. At time T1, when the detected pressure signal becomes larger than the set pressure signal, the flow rate control valve 14 opens and suction of gas is started by the dry pump 6. When the gas flows, the flow rate signal is added to the set pressure signal at a predetermined ratio. Accordingly, as the flow rate signal increases, the set pressure signal increases.

At time T2, when an amount of gas flowing into the chamber 3 exceeds an amount of gas sucked out from the chamber 3, the detected pressure signal decreases. Accordingly, since the difference between the detected pressure signal and the set pressure signal decreases, a flow rate of gas also decreases, the addition amount to the set pressure signal also decreases, and the set pressure signal decreases. Therefore, after time T2, the detected pressure signal and the set pressure signal approach a same level and, at time T3, the detected pressure signal and the set pressure signal become approximately equal to each other to create a pressure constant control state where the detected pressure signal and the set pressure signal are approximately constant while the flow rate control valve 14 remains at a certain degree of opening.

However, since adding the flow rate signal to the set pressure signal on the basis of the flow rate of gas still continues, the detected pressure signal and the set pressure signal are controlled to be constant at a higher level than an original level of the set pressure signal indicated by a dashed-dotted line. Therefore, at time T4, once a certain period of time has elapsed in the pressure constant control state where the detected pressure signal and the set pressure signal are approximately equal to each other, the addition amount to the set pressure signal is gradually reduced to zero. Accordingly, after time T5 elapses, constant control is attained at an original level of the set pressure signal.

In this case, in step S8 shown in FIG. 5, the flow rate control valve 14 is controlled to a degree of opening in accordance with a valve drive signal and, in step S11, the flow rate control valve 14 is changed to a closed state. In addition, in step S3, by adding the flow rate signal to the set pressure signal at a predetermined ratio and repetitively performing step S13, the addition amount to the set pressure signal is gradually reduced to zero.

In addition, the circuit provided in the pressure control device 1 may be any of an analog circuit and a digital circuit. Furthermore, while the pressure control target in the embodiment described above is the chamber 3, the pressure control target may be a pressure vessel or the like.

In addition, while a flow rate signal is subtracted from a set pressure signal at a predetermined ratio in the embodiment described above, the flow rate signal may be added to a detected pressure signal at a predetermined ratio.

What is claimed is:

1. A pressure control device which controls a flow rate of gas supplied to a pressure control target to maintain an inside of the pressure control target at set pressure, the pressure control device comprising:
   a controller, wherein the controller is configured to:
      determine whether or not an amount of variation of a detected pressure signal indicating pressure within the pressure control target in a certain period of time is within a predetermined range;
      subtract, at a predetermined ratio, a signal related to the supply of gas from a set pressure signal indicating the set pressure, when it is determined that the amount of variation of the detected pressure signal in the certain period time is not within the predetermined range and when gas is being supplied into the pressure control target in order to bring the inside of the pressure control target to the set pressure;
      reduce a subtraction amount from the set pressure signal in accordance with an amount of elapsed time since the set pressure signal has been subjected to the subtraction and set the subtraction amount to zero over a predetermined amount of time when it is determined that the amount of variation of the detected pressure signal in the certain period time is within the predetermined range;

compare the detected pressure signal with the set pressure signal subjected to the subtraction; and control, on the basis of a comparison result obtained by the controller, a flow rate control valve which controls a flow rate of gas supplied to the pressure control target.

2. The pressure control device according to claim 1, wherein the signal related to the supply of gas is a flow rate signal indicating a flow rate of gas supplied to the pressure control target or a valve drive signal for controlling opening/closing of the flow rate control valve.

3. A pressure control device which controls a flow rate of gas that flows out from a pressure control target to maintain an inside of the pressure control target at set pressure, the pressure control device comprising:

a controller, wherein the controller is configured to:

determine whether or not an amount of variation of a detected pressure signal indicating pressure within the pressure control target in a certain period of time is within a predetermined range;

add, at a predetermined ratio, a signal related to the outflow of gas to a set pressure signal indicating the set pressure, when the amount of variation of the detected pressure signal in the certain period time is not within the predetermined range and when gas is caused to flow out from the pressure control target in order to bring the inside of the pressure control target to the set pressure;

reduce an addition amount to the set pressure signal in accordance with an amount of elapsed time since the set pressure signal has been subjected to the addition and set the addition amount to zero over a predetermined amount of time when the amount of variation of the detected pressure signal in the certain period time is within the predetermined range;

compare the detected pressure signal with the set pressure signal subjected to the addition; and control, on the basis of a comparison result obtained by the controller, a flow rate control valve which controls a flow rate of gas that flows out from the pressure control target.

4. The pressure control device according to claim 3, wherein the signal related to the outflow of gas is a flow rate signal indicating a flow rate of gas that flows out from the pressure control target or a valve drive signal for controlling opening/closing of the flow rate control valve.

5. A pressure control system, comprising:

a gas supply source configured to supply gas;

a pressure control target to which gas is supplied from the gas supply source; a pressure sensor configured to detect pressure within the pressure control target; and the pressure control device according to claim 1 which is provided between the gas supply source and the pressure control target and which is configured to control a flow rate of gas supplied to the pressure control target to maintain the pressure control target at set pressure.

6. A pressure control system, comprising:

a gas supply source configured to supply gas;

a pressure control target to which gas is supplied from the gas supply source;

a pressure sensor configured to detect pressure within the pressure control target; and the pressure control device according to claim 3 which is provided on a secondary side of the pressure control target and which is configured to control a flow rate of gas that flows out from the pressure control target to maintain the pressure control target at set pressure.

* * * * *